(12) United States Patent
Lee

(10) Patent No.: US 7,282,968 B2
(45) Date of Patent: Oct. 16, 2007

(54) DATA OUTPUT DRIVER AND SEMICONDUCTOR MEMORY DEVICE HAVING THE SAME

(75) Inventor: Dong-Jin Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 98 days.

(21) Appl. No.: 11/327,688

(22) Filed: Jan. 6, 2006

(65) Prior Publication Data

US 2006/0152467 A1  Jul. 13, 2006

(30) Foreign Application Priority Data

Jan. 7, 2005  (KR) .................. 10-2005-0001876

(51) Int. Cl.
*H03B 1/00*  (2006.01)
*H03K 3/00*  (2006.01)

(52) U.S. Cl. .................. 327/112; 327/170; 327/111; 326/26; 326/27; 326/87

(58) Field of Classification Search ................ 327/112, 327/170; 326/26, 27
See application file for complete search history.

(56) References Cited

U.S. PATENT DOCUMENTS

| | | | | |
|---|---|---|---|---|
| 5,850,159 | A | * | 12/1998 | Chow et al. ................. 327/394 |
| 6,094,086 | A | * | 7/2000 | Chow .......................... 327/396 |
| 6,130,563 | A | * | 10/2000 | Pilling et al. ............... 327/111 |
| 6,281,730 | B1 | * | 8/2001 | Vu .............................. 327/170 |
| 6,504,396 | B2 | | 1/2003 | Sher et al. .................... 326/21 |
| 6,646,483 | B2 | * | 11/2003 | Shin ........................... 327/112 |
| 2003/0042953 | A1 | * | 3/2003 | Shin ........................... 327/170 |
| 2004/0076039 | A1 | | 4/2004 | Chung et al. .......... 365/189.05 |
| 2004/0251940 | A1 | | 12/2004 | Hayashi et al. ............. 327/170 |
| 2005/0105294 | A1 | * | 5/2005 | Cho et al. ................... 362/458 |
| 2005/0225363 | A1 | * | 10/2005 | Lee ............................. 327/112 |

FOREIGN PATENT DOCUMENTS

JP  2004-327602  11/2004
KR  10-2004-0034845  4/2004

* cited by examiner

*Primary Examiner*—Vibol Tan
(74) *Attorney, Agent, or Firm*—Mills & Onello LLP

(57) ABSTRACT

A data output driver and a semiconductor memory device having the same are disclosed. This data output driver includes: a rising transition slope adjuster including a plurality of first delay units cascade-connected to each other and receiving data and generating delayed data, each of the first delay units having a delay time which varies in response to a first control signal; a falling transition slope adjuster including a plurality of second delay units cascade-connected to each other and receiving inverted data and generating delayed inverted data, each of the second delay units having a delay time which varies in response to a second control signal; a pull-up driver including a plurality of pull-up circuits, the driving capabilities of the pull-up circuits being adjustable in response to a third control signal, each pull-up circuit pulling-up output data in response to each of the data and the delayed data; and a pull-down driver including a plurality of pull-down circuits, the driving capabilities of the pull-down circuits being adjustable in response to a fourth control signal, each pull-down circuit pulling-down output data in response to each of the inverted data and the delayed inverted data, wherein the first control signal varies in response to the third control signal, and wherein the second control signal varies in response to the fourth control signal. Accordingly, the rising and falling transition slopes of the output data can be constant even when the driving capability is varied, so that output data having desired characteristics can be produced.

28 Claims, 7 Drawing Sheets

DATA OUTPUT DRIVER AND SEMICONDUCTOR MEMORY DEVICE HAVING THE SAME

CROSS-REFERENCE TO RELATED APPLICATION

This application claims the benefit of Korean Patent Application No. 10-2005-0001876, filed Jan. 7, 2005, the disclosure of which is hereby incorporated herein by reference in its entirety.

BACKGROUND OF THE INVENTION

1. Field of the Invention

The present invention relates to a data output driver, and more particularly, to a data output driver and a semiconductor memory device having the same which can adjust driving capability.

2. Description of the Related Art

A conventional data output driver includes a pull-up driver composed of a predetermined number of pull-up circuits and a pull-down driver composed of a predetermined number of pull-down circuits, and generates output data. Driving capability can be controlled by adjusting the number of enabled pull-up circuits and the number of enabled pull-down circuits constituting the pull-up driver and the pull-down driver, respectively, and the slopes of rising and falling transition of the output data can be adjusted by differing operating times of the pull-up circuits and the pull-down circuits when the output data is transferred.

FIG. 1 illustrates an example of the conventional data output driver, which includes inverters 11 and 12, a pull-up driver 10, a pull-down driver 20, a rising transition slope adjuster 30, a falling transition slope adjuster 40, a pull-up drive control signal generator 50, and a pull-down drive control signal generator 60.

Referring to FIG. 1, the pull-up driver 10 consists of n pull-up circuits 10-1 to 10-$n$, the pull-down driver 20 consists of n pull-down circuits 20-1 to 20-$n$, each of the n pull-up circuits 10-1 to 10-$n$ consists of a pre driver 12-1 to 12-$n$ and a main driver 14-1 to 14-$n$, and each of the n pull-down circuits 20-1 to 20-$n$ consists of a pre driver 22-1 to 22-$n$ and a main driver 24-1 to 24-$n$. Each of the pre drivers 12-1 to 12-$n$ consists of PMOS transistors P1 and P2 and NMOS transistors N1 and N2, each of the main drivers 14-1 to 14-$n$ consists of a PMOS transistor P3, each of the pre drivers 22-1 to 22-$n$ consists of PMOS transistors P4 and P5 and NMOS transistors N3 and N4, and each of the main drivers 24-1 to 24-$n$ consists of an NMOS transistor N5. The rising transition slope adjuster 30 consists of n delay units 30-1 to 30-$n$ connected in a cascade arrangement, and the falling transition slope adjuster 40 consists of n delay units 40-1 to 40-$n$ connected in a cascade arrangement.

Referring to FIG. 1, a control signal CON1 consists of i-bit data to set delay times of the delay units 30-1 to 30-$n$, and a control signal CON2 consists of i-bit data to set delay times of the delay units 40-1 to 40-$n$. A control signal CON3 consists of n-bit control signals CON31 to CON3$n$ to enable operation of each of the pull-up circuits 10-1 to 10-$n$, and a control signal CON4 consists of n-bit control signals CON41 to CON4$n$ to enable operation of each of the pull-down circuits 20-1 to 20-$n$.

Operation of the circuits shown in FIG. 1 is now described as follows. First, operation of each of the pull-up circuits 10-1 to 10-$n$ will be described.

When a corresponding bit of the control signal CON3 is at a "low" level, the NMOS transistor N2 is turned off and the PMOS transistor P2 is turned on. Accordingly, a signal of "high" level is applied to a gate of the PMOS transistor P3, which turns the PMOS transistor P3 off. Consequently, the corresponding pull-up circuit is disabled. On the other hand, when the corresponding bit of the control signal CON3 is at a "high" level, the NMOS transistor N2 is turned on and the PMOS transistor P2 is turned off. In this state, a signal of "low" level is applied to a gate of the PMOS transistor P3 when the signal of "high" level is applied to gates of the NMOS transistor N1 and the PMOS transistor P1, and a signal of "high" level is applied to the gate of the PMOS transistor P3 when the signal of "low" level is applied to the gates of the NMOS transistor N1 and the PMOS transistor P1. The PMOS transistor P3 generates output data DQ at a "high" level when the signal of "low" level is applied to its gate.

Delay times of the delay units 30-1 to 30-$n$ of the rising transition slope adjuster 30 are adjusted in response to the control signal CON1, and the pull-up circuits enabled in response to the control signal CON3 among the pull-up circuits 10-1 to 10-$n$ sequentially perform operations in response to the output signal of the inverter I1 delayed by the delay units 30-1 to 30-$n$. Accordingly, the rising transition slope of the output data DQ is adjusted.

The pull-up drive control signal generator 50 is initially set to a predetermined value, enabled in response to a pull-up control signal PUCON, increases the set value in response to a pull-up increase control signal UICON, and decreases the set value in response to a pull-up decrease control signal UDCON, thereby generating a control signal CON3.

Operation of each of the pull-down circuits 20-1 to 20-$n$ will now be described as follows.

When the corresponding bit of the control signal CON4 is at a "high" level, the PMOS transistor P4 is turned off and the NMOS transistor N4 is turned on so that a signal of "low" level is applied to a gate of the NMOS transistor N5, which turns the NMOS transistor N5 off. Consequently, the corresponding pull-down circuit is disabled. On the other hand, when the corresponding bit of the control signal CON4 is at a "low" level, the PMOS transistor P4 is turned on and the NMOS transistor N4 is turned off. In this state, a signal of "low" level is applied to the gate of the NMOS transistor N5 when the signal of "high" level is applied to the gates of the NMOS transistor N3 and the PMOS transistor P5, and a signal of "high" level is applied to the gate of the NMOS transistor N5 when the signal of "low" level is applied to the gate of the NMOS transistor N5. The NMOS transistor N5 generates output data DQ at a "low" level when the signal of "high" level is applied to its gate.

In the falling transition slope adjuster 40, delay times of the delay units 40-1 to 40-$n$ are adjusted in response to the control signal CON2, and the pull-down circuits enabled in response to the control signal CON4 among the pull-down circuits 20-1 to 20-$n$ sequentially perform operations in response to the output signals of the inverter I2 delayed by the delay units 40-1 to 40-$n$. Accordingly, the falling transition slope of the output data DQ is adjusted.

The pull-down drive control signal generator 60 is initially set to a predetermined value, enabled in response to a pull-down control signal PDCON, increases the set value in response to a pull-down increase control signal DICON, and decreases the set value in response to a pull-down decrease control signal DDCON, thereby generating the control signal CON4.

The conventional data output driver shown in FIG. 1 could adjust the driving capability of the pull-up and pull-down drivers 10 and 20 in response to the control signals CON3 and CON4, and could adjust the rising and falling transition slopes of the output data DQ in response to the control signals CON1 and CON2.

In general, the delay times of the delay units 30-1 to 30-*n* and 40-1 to 40-*n* can be fixed or varied in response to the control signals CON1 and CON2 so that the rising and falling transition slopes of the output data DQ can be adjusted, and the control signals CON3 and CON4 are varied so that the driving capability of the pull-up and pull-down drivers 10 and 20 can be varied.

However, when the driving capability of the data output driver is varied, the rising and falling transition slopes of the output data are also changed. Accordingly, the rising and falling transition slopes may be out of a desired range in response to a change in driving capability. For example, the rising and falling transition slopes increase when the driving capability of the pull-up and pull-down drivers 10 and 20 increase, and decrease when the driving capability decreases. Thus, it is cumbersome to adjust the slope to be within the desired range by varying the delay times of the delay units 30-1 to 30-*n* and 40-1 to 40-*n* using the control signals CON1 and CON2. When the delay times of the delay units 30-1 to 30-*n* and 40-1 to 40-*n* are fixed in response to the control signals CON1 and CON2, it becomes impossible to adjust the slopes to be within the desired range.

Consequently, it is cumbersome to adjust the slopes again when the rising and falling transition slopes of the output data change in response to a change in driving capability in the conventional data output driver. In some cases, the slopes may not be adjusted at all so that the desired output data cannot be produced.

SUMMARY OF THE INVENTION

An embodiment of the invention provides a data output driver capable of automatically varying rising and falling transition slopes in response to a change in driving capability.

Another embodiment of the invention provides a semiconductor memory device having the above-described data output driver.

In one aspect, the invention is directed to a data output driver including: a rising transition slope adjuster including a plurality of first delay units cascade-connected to each other and receiving data and generating delayed data, each of the first delay units having a delay time which varies in response to a first control signal; a falling transition slope adjuster including a plurality of second delay units cascade-connected to each other and receiving inverted data and generating delayed inverted data, each of the second delay units having a delay time which varies in response to a second control signal; a pull-up driver including a plurality of pull-up circuits, and adjusting driving capabilities of the pull-up circuits in response to a third control signal, each pull-up circuit pulling-up output data in response to each of the data and the delayed data of the first delay units; and a pull-down driver including a plurality of pull-down circuits, and adjusting driving capabilities of the pull-down circuits in response to a fourth control signal, each pull-down circuit pulling-down output data in response to each of the inverted data and the delayed inverted data of the second delay units, wherein the first control signal varies in response to the third control signal, and the second control signal varies in response to the fourth control signal.

In another aspect, the invention is directed to a data output driver including: a rising transition slope adjuster including a plurality of first delay units cascade-connected to each other and receiving data and generating delayed data, each of the first delay units having a delay time which varies in response to a first control signal; a falling transition slope adjuster including a plurality of second delay units cascade-connected to each other and receiving inverted data and generating delayed inverted data, each of the second delay units having a delay time which varies in response to a second control signal; a pull-up driver including a plurality of pull-up circuits, and adjusting driving capabilities of the pull-up circuits in response to a third control signal, each pull-up circuit pulling-up output data in response to each of the data and the delayed data of the first delay units; a pull-down driver including a plurality of pull-down circuits, and adjusting driving capabilities of the pull-down circuits in response to a fourth control signal, each pull-down circuit pulling-down output data in response to each of the inverted data and the delayed inverted data of the second delay units; and a control signal generator varying the first control signal and the third control signal together in response to a pull-up control signal, and varying the second control signal and the fourth control signal together in response to a pull-down control signal to generate the first to fourth control signals.

The control signal generator may include: a pull-up drive control signal generator varying the third control signal in response to the pull-up control signal; a pull-down drive control signal generator varying the fourth control signal in response to the pull-down control signal; a rising transition slope control signal generator having an initial value set in response to a fifth control signal, and varying the first control signal in response to the pull-up control signal; and a falling transition slope control signal generator having an initial value set in response to a sixth control signal, and varying the second control signal in response to the pull-down control signal.

The rising transition slope adjuster may increase delay times of the first delay units in response to the first control signal when the driving capability of the pull-up driver increases in response to the third control signal, and decrease the delay times of the first delay units in response to the first control signal when the driving capability of the pull-up driver decreases in response to the third control signal. The falling transition slope adjuster increases delay times of the second delay units in response to the second control signal when the driving capability of the pull-down driver increases in response to the fourth control signal, and decreases the delay times of the second delay units in response to the second control signal when the driving capability of the pull-down driver decreases in response to the fourth control signal.

In still another aspect, the invention is directed to a data output driver including: a rising transition slope adjuster including a plurality of first delay units cascade-connected to each other and receiving data and generating delayed data; a falling transition slope adjuster including a plurality of second delay units cascade-connected to each other and receiving inverted data and generating delayed inverted data; a pull-up driver including a plurality of pull-up circuits, adjusting delay times of the pull-up circuits in response to a first control signal, and adjusting driving capabilities of the pull-up circuits in response to a third control signal, each pull-up circuit pulling-up output data in response to each of the data and the delayed data of the first delay units; and a pull-down driver including a plurality of pull-down circuits, adjusting delay times of the pull-down circuits in response to a second control signal, and adjusting driving capabilities of the pull-down circuits in response to a fourth control signal, each pull-down circuit pulling-down output data in response to each of the inverted data and the delayed inverted data and the second delay units, wherein the first control signal varies in response to the third control signal, and the second control signal varies in response to the fourth control signal.

In yet another aspect, the invention is directed to a data output driver including: a rising transition slope adjuster including a plurality of first delay units cascade-connected to each other and receiving data and generating delayed data; a falling transition slope adjuster including a plurality of second delay units cascade-connected to each other and receiving inverted data and generating delayed inverted data; a pull-up driver including a plurality of pull-up circuits, adjusting delay times of the pull-up circuits in response to a first control signal, and adjusting driving capabilities of the pull-up circuits in response to a third control signal, each of the pull-up circuits pulling-up output data in response to each of the data and the delayed data of the first delay units; a pull-down driver including a plurality of pull-down circuits, adjusting delay times of the pull-down circuits in response to a second control signal, and adjusting driving capabilities of the pull-down circuits in response to a fourth control signal, each of the pull-down circuits pulling-down output data in response to each of the inverted data and the delayed inverted data of the second delay units; and a control signal generator varying the first control signal and the third control signal together in response to a pull-up control signal, and varying the second control signal and the fourth control signal together in response to a pull-down control signal to generate the first to fourth control signals.

The control signal generator may include: a pull-up drive control signal generator varying the third control signal in response to the pull-up control signal; a pull-down drive control signal generator varying the fourth control signal in response to the pull-down control signal; a rising transition slope control signal generator having an initial value set in response to a fifth control signal, and varying the first control signal in response to the pull-up control signal; and a falling transition slope control signal generator having an initial value set in response to a sixth control signal, and varying the second control signal in response to the pull-down control signal.

The rising transition slope adjuster may increase a delay time of each of the pull-up circuits in response to the first control signal when the driving capability of the pull-up driver increases in response to the third control signal, and decrease the delay time of each of the pull-up circuits in response to the first control signal when the driving capability of the pull-up driver decreases in response to the third control signal. The falling transition slope adjuster may increase a delay time of each of the pull-down circuits in response to the second control signal when the driving capability of the pull-down driver increases in response to the fourth control signal, and decrease the delay time of each of the pull-down circuits in response to the second control signal when the driving capability of the pull-down driver decreases in response to the fourth control signal.

In yet another aspect, the invention is directed to a semiconductor memory device including: a memory cell array outputting stored data during a read operation; a data output unit receiving the read data output from the memory cell array and outputting data and inverted data; a command decoder decoding an externally applied command and generating a mode setting command; a control signal setting unit receiving a code in response the mode setting command, and outputting a pull-up control signal and a pull-down control signal from the received code; a rising transition slope adjuster including a plurality of first delay units cascade-connected to each other and receiving data and generating delayed data, each of the first delay units having a delay time which varies in response to a first control signal; a falling transition slope adjuster including a plurality of second delay units cascade-connected to each other and receiving inverted data and generating delayed inverted data, each of the second delay units having a delay time which varies in response to a second control signal; a pull-up driver including a plurality of pull-up circuits, and adjusting driving capabilities of the pull-up circuits in response to a third control signal, each of the pull-up circuits pulling-up output data in response to each of the data and the delayed data of the first delay units; a pull-down driver including a plurality of pull-down circuits, and adjusting driving capabilities of the pull-down circuits in response to a fourth control signal, each of the pull-down circuits pulling-down output data in response to each of the inverted data and the delayed inverted data of the second delay units; and a control signal generator varying the first control signal and the third control signal in response to the pull-up control signal, and varying the second control signal and the fourth control signal in response to the pull-down control signal to generate the first to fourth control signals.

In yet another aspect, the invention is directed to a semiconductor memory device including: a memory cell array outputting stored data during a read operation; a data output unit receiving the read data output from the memory cell array and outputting data and inverted data; a command decoder decoding an externally applied command and generating a mode setting command; a control signal setting unit receiving a code in response the mode setting command, and outputting a pull-up control signal and a pull-down control signal from the received code; a rising transition slope adjuster including a plurality of first delay units cascade-connected to each other and receiving data and generating delayed data; a falling transition slope adjuster including a plurality of second delay units cascade-connected to each other and receiving inverted data and generating delayed inverted data; a pull-up driver including a plurality of pull-up circuits, adjusting delay times of the pull-up circuits in response to a first control signal, and adjusting driving capabilities of the pull-up circuits in response to a third control signal, each of the pull-up circuits pulling-up output data in response to each of the data and the delayed data of the first delay units; a pull-down driver including a plurality of pull-down circuits, adjusting delay times of the pull-down circuits in response to a second control signal, and adjusting driving capabilities of the pull-down circuits in response to a fourth control signal, each of the pull-down circuits pulling-down output data in response to each of the inverted data and the delayed inverted data of the second delay units; and a control signal generator varying the first control signal and the third control signal in response to the pull-up control signal, and varying the second control signal and the fourth control signal in response to the pull-down control signal to generate the first to fourth control signals.

The control signal generator may include: a pull-up drive control signal generator varying the third control signal in response to the pull-up control signal; a pull-down drive control signal generator varying the fourth control signal in response to the pull-down control signal; a rising transition slope control signal generator having an initial value set in response to a fifth control signal, and varying the first control signal in response to the pull-up control signal; and a falling transition slope control signal generator having an initial value set in response to a sixth control signal, and varying the second control signal in response to the pull-down control signal. In addition, the control signal generator may include: a pull-up drive control signal generator varying the third control signal in response to the pull-up control signal; a pull-down drive control signal generator varying the fourth control signal in response to the pull-down control signal; a rising transition slope control signal generator having an initial value set in response to a fifth control signal, and varying the first control signal in response to the third control signal; and a falling transition slope control signal generator having an initial value set in response to a sixth control signal, and varying the second control signal in response to the fourth control signal.

BRIEF DESCRIPTION OF THE DRAWINGS

The foregoing and other objects, features and advantages of the invention will be apparent from the more particular description of a preferred embodiments of the invention, as illustrated in the accompanying drawings. The drawings are not necessarily to scale, emphasis instead being placed upon illustrating the principles of the invention.

DETAILED DESCRIPTION OF THE INVENTION

A data output driver and a semiconductor memory device having the data output driver of the present invention will now be described more fully hereinafter with reference to the accompanying drawings.

Figure 1:
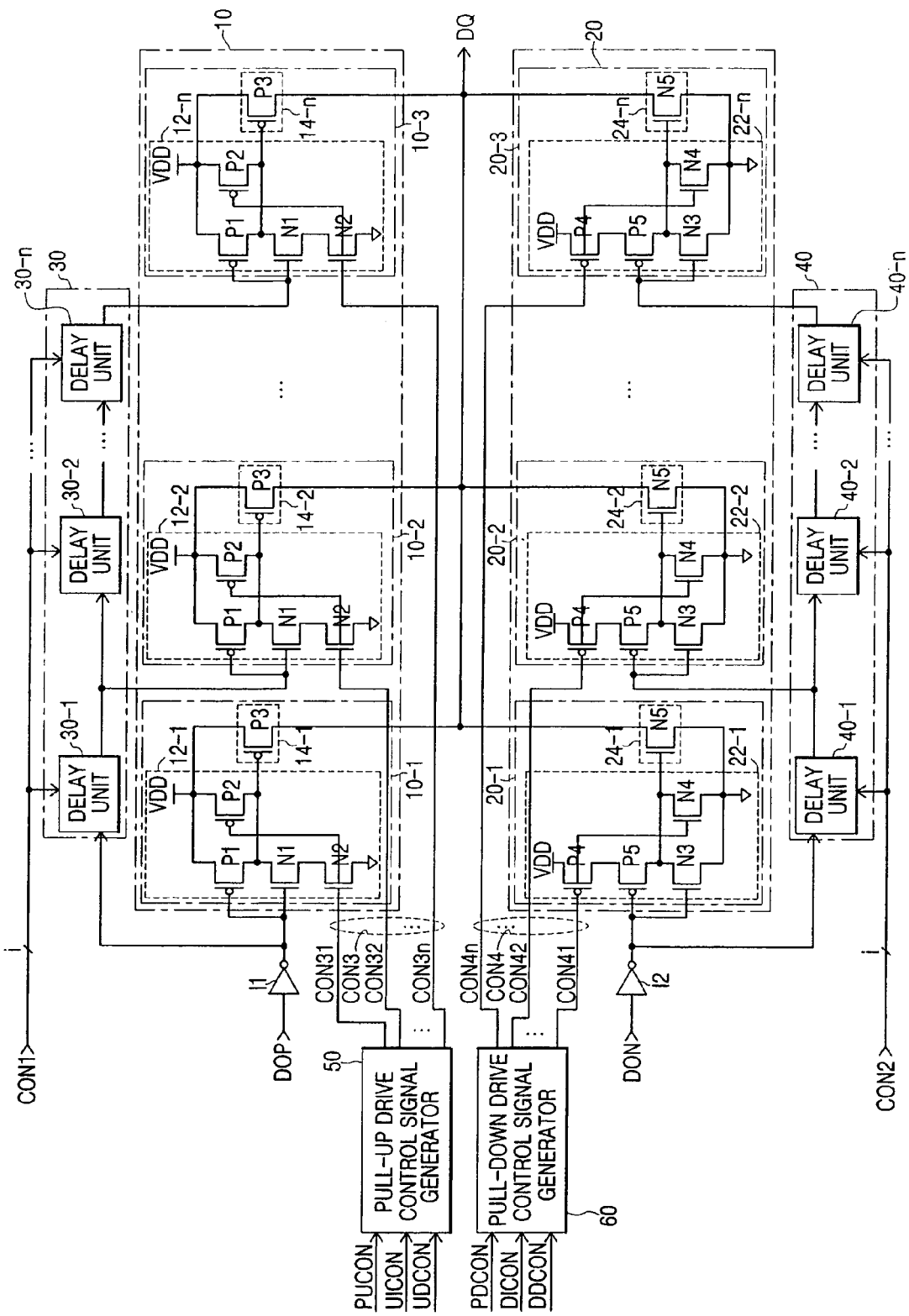
FIG. 1 is a circuit diagram illustrating an example of a conventional data output driver.
Figure 2:
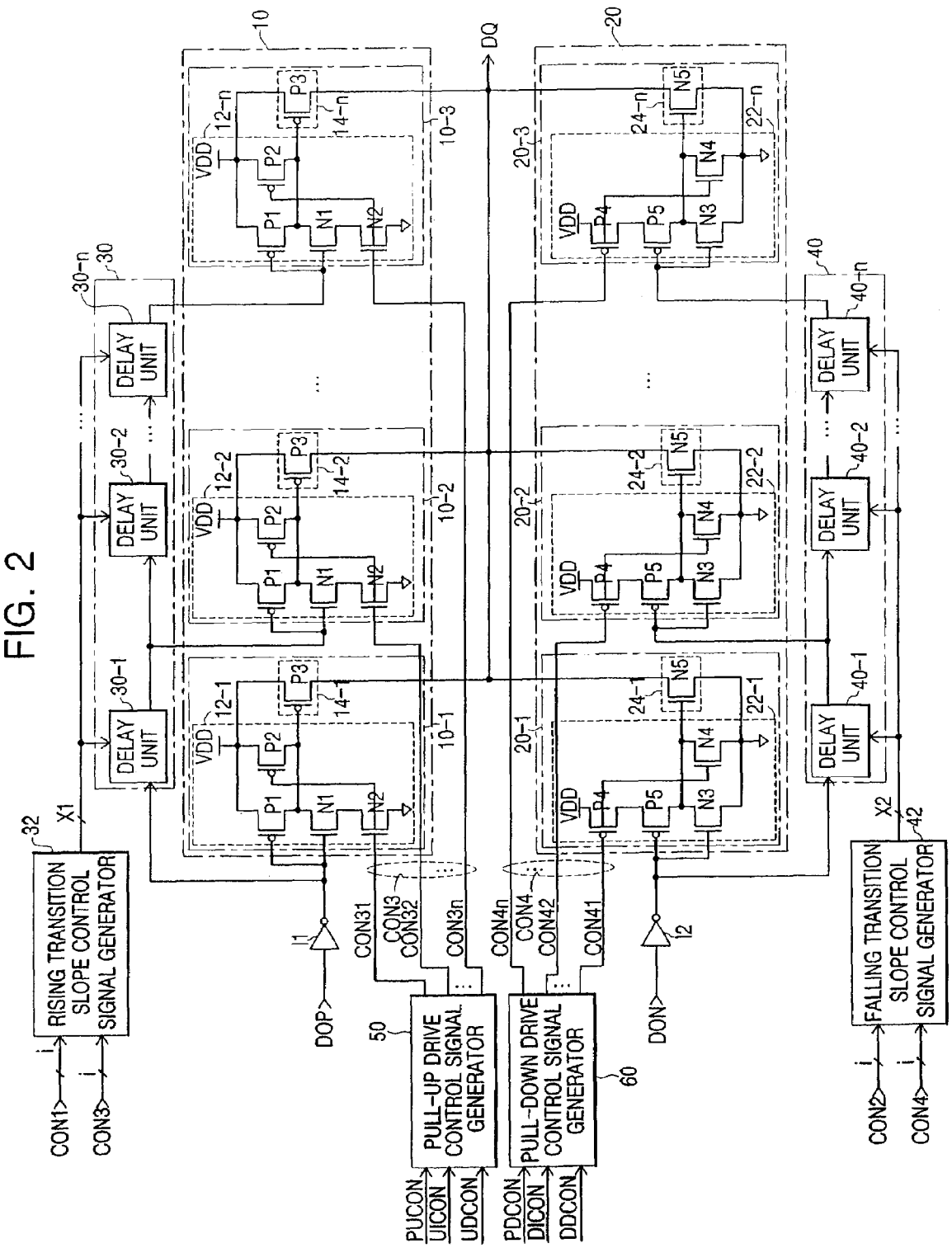
FIG. 2 is a circuit diagram illustrating the structure of a data output driver in accordance with a first embodiment of the present invention.

FIG. 2 is a diagram illustrating the structure of a data output driver in accordance with a first embodiment of the present invention. In this embodiment, a rising transition slope control signal generator 32 and a falling transition slope control signal generator 42 are added to the data output driver shown in FIG. 1.

Functions of the same components as those shown in FIG. 1 will not be described, and only functions of additional components will be described hereinafter.

The rising transition slope control signal generator 32 varies delay times of delay units 30-1 to 30-$n$ in response to control signals CON1 and CON3, and the falling transition slope control signal generator 42 varies delay times of delay units 40-1 to 40-$n$ in response to control signals CON2 and CON4. The rising transition slope control signal generator 32 has an initial value set in response to the control signal CON1, and generates a control signal X1 that is increased or decreased with respect to the initial value in response to the control signal CON3. The falling transition slope control signal generator 42 has an initial value set in response to the control signal CON2, and generates a control signal X2 that is increased or decreased with respect to the initial value in response to the control signal CON4.

In the data output driver shown in FIG. 2, the delay times of the delay units 30-1 to 30-$n$ and 40-1 to 40-$n$ are not fixed in response the control signals CON1 and CON2, but varied further according to changes in pull-up and pull-down driving capabilities in response to the control signals CON3 and CON4. Accordingly, when the pull-up and pull-down driving capabilities of the driver are changed, the rising and falling transition slopes of the output data are also changed, so that the output data having transition slopes within a desired range can be produced.

For example, when the rising and falling transition slopes of the output data are fixed while the pull-up and the pull-down driving capabilities increase, the slopes of the output data can increase so that the slopes of the output data may not be within the desired range. In the case of the present invention, the data output driver of the present invention lengthens the delay times of the delay units 30-1 to 30-$n$ and 40-1 to 40-$n$ in response to the control signals CON3 and CON4 when the pull-up and the pull-down driving capabilities increase, so that any increase in the transition slopes can be suppressed when the pull-up and the pull-down driving capabilities increase, which makes the transition slopes of the output data substantially constant.

Figure 3:
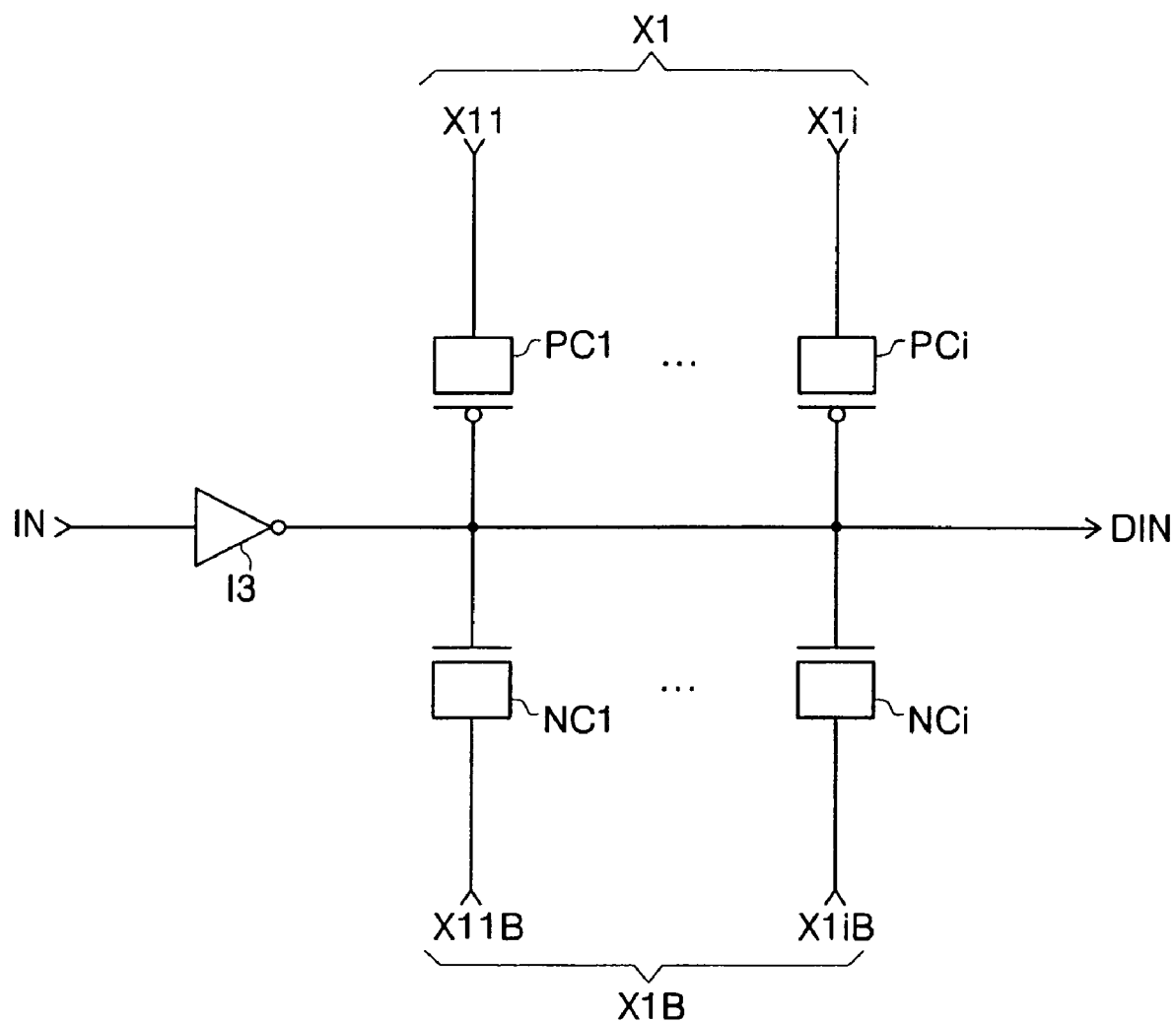
FIG. 3 is a circuit diagram of a delay unit shown in FIG. 2.

FIG. 3 is a circuit diagram of the delay unit 30-$n$, 40-$n$ shown in FIG. 2, which is composed of an inverter I3, PMOS capacitors PC1 to PCi, and NMOS capacitors NC1 to NCi. Referring to FIG. 3, X11 to X1$i$ denote a control signal X1, and X11B to X11B denote an inverted control signal X1B of the control signal X1.

Operation of the delay unit shown in FIG. 3 will now be described.

The delay unit delays an input signal IN by a predetermined time in response to the control signals X11 to X1$i$ and X11B to X1$i$B, thereby producing an output signal DIN. When the control signals X11 to X1$i$ at a "high" level are applied and the output signal DIN of "low" level is produced, all of the PMOS capacitors PC1 to PCi are connected to a node where the output signal DIN is produced so that the capacitance of the node becomes maximized, which in turn maximizes the delay time of the delay unit, and when the control signals X11 to X1$i$ at a "high" level are applied and an output signal DIN at a "high" level is produced, all of the NMOS capacitors NC1 to NCi are connected to the node where the output signal DIN is produced so that the capacitance of the node becomes maximized, which in turn maximizes the delay time of the delay unit. On the other hand, when the control signals X11 to X1$i$ at a "low" level are applied, all of the PMOS capacitors PC1 to PCi and the NMOS capacitors NC1 to NCi are not connected to the node where the output signal DIN is produced, so that the capacitance of the node becomes minimized, which in turn minimizes the delay time of the delay unit.

That is, the number of connection between the NMOS and PMOS capacitors NC1 to NC1 and PC1 to PCi and the node where the output signal DIN is produced is adjusted by the control signals X11 to X1$i$, so that the delay times of the delay units are controlled.

Figure 4:
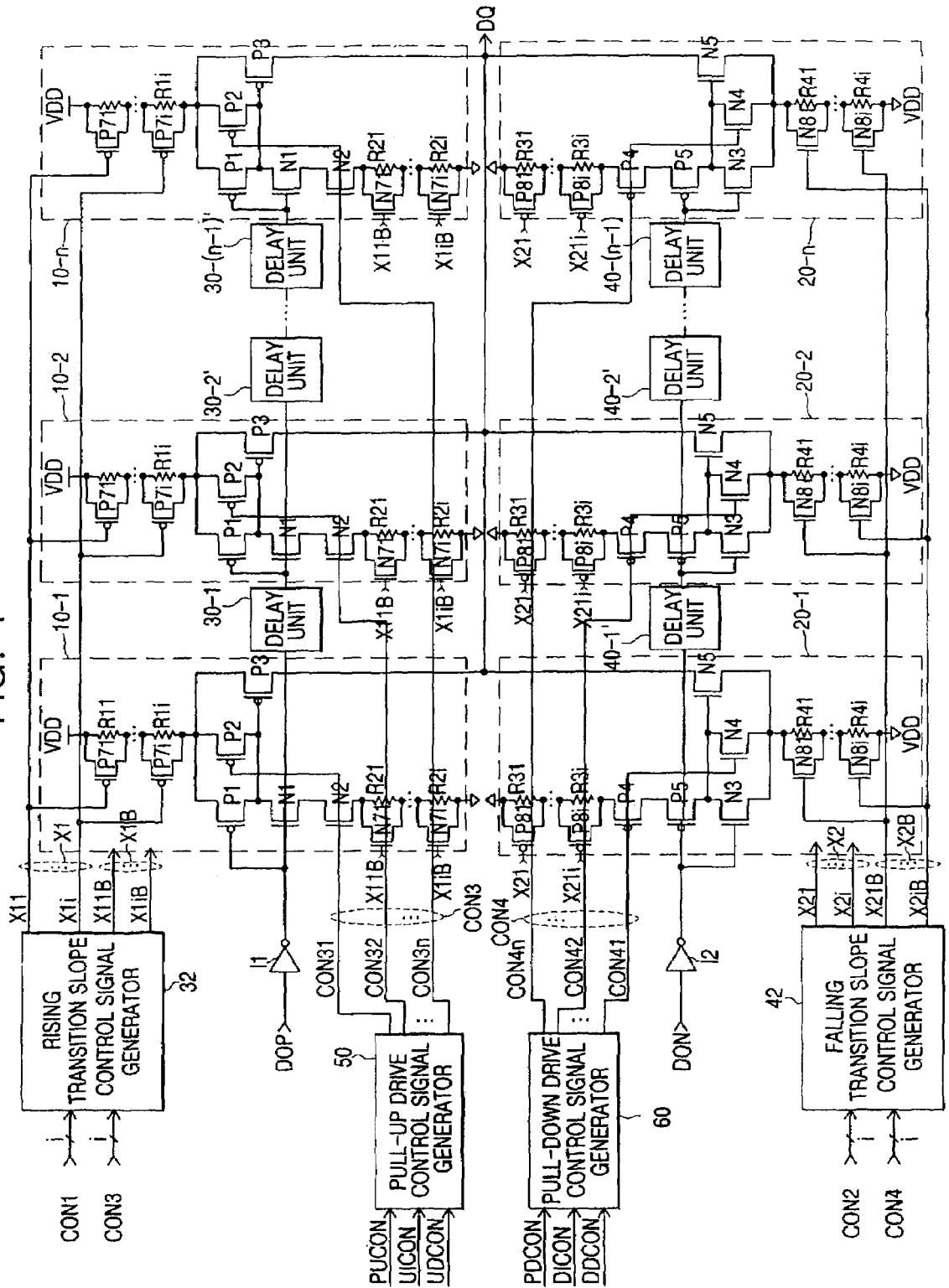
FIG. 4 is a circuit diagram illustrating the structure of a data output driver in accordance with a second embodiment of the present invention.

FIG. 4 is a diagram illustrating the structure of a data output driver in accordance with a second embodiment of the present invention, which replaces the delay units 30-1 to 30-n of FIG. 1 with delay units 30-1' to 30-n', and additionally includes resistors R11 to R1i connected in series between a power supply voltage and sources of PMOS transistors P2 of pull-up circuits 10-1 to 10-n, PMOS transistors P71 to P7i connected parallel to the respective resistors R11 to R1i, resistors R21 to R2i connected in series between a ground voltage and sources of NMOS transistors N4 of the pull-up circuits 10-1 to 10-n, and NMOS transistors N71 to N7n connected parallel to the respective resistors R21 to R2i. In addition, resistors R31 to R3i connected in series between the power supply voltage and sources of PMOS transistors P4 of pull-down circuits 20-1 to 20-n, and NMOS transistors N81 to N8i connected parallel to the respective resistors R31 to R3i are added to the circuit of FIG. 1.

Referring to FIG. 4, X11 to X1i denote a control signal X1, X11B to X1iB denote an inverted control signal X1B of the control signal X1, X21 to X2i denote a control signal X2, and X21B to X2iB denote an inverted control signal X2B of the control signal X2.

Functions of the same components as those shown in FIG. 1 will not be described, and only functions of added or replaced components will be described hereinafter.

The delay unit 30-1' delays data DOP by a fixed delay time, and the delay unit 30-2' delays an output signal of the delay unit 30-1' by a fixed delay time. That is, an output signal of the previous delay unit of each of the delay units 30-1' to 30-n' is input to the current delay unit, and then delayed by a fixed delay time and output. Accordingly, the pull-up circuits 10-1 to 10-n sequentially operate with an interval of the delay time.

The delay unit 40-1' delays data DON by a fixed delay time, and the delay unit 40-2' delays an output signal of the delay unit 40-1' by a fixed delay time. That is, an output signal of the previous delay unit of each of the delay units 40-1' to 40-n' is input to the current delay unit, and then delayed by the fixed delay time and output. Accordingly, the pull-down circuits 20-1 to 20-n sequentially operate with an interval of the delay time.

In the pull-up circuits 10-1 to 10-n, when all of the PMOS transistors P71 to P7i and the NMOS transistors N71 to N7i are turned off in response to the control signals X11B to X1iB of "low" level and the control signals X11 to X1i of "high" level, all of the resistors R11 to R1i and the resistors R21 to R2i are connected to each other, so that the rising and falling transition slopes of the output signal of the pull-up circuits 10-1 to 10-n are minimized. On the other hand, when all of the PMOS transistors P71 to P7i and the NMOS transistors N71 to N7i are turned on in response to the control signals X11 to X1i of "low" level and the control signals X11B to X1iB of "high" level, all of the resistors R11 to R1i and the resistors R21 to R2i are not connected to each other, so that the rising and falling transition slopes of the output signal of the pull-up circuits 10-1 to 10-n are maximized.

That is, the number of the NMOS transistors N71 to N7i and the PMOS transistors P71 to P7i turned on by the control signals X11 to X1i is adjusted, so that the rising and falling transition slopes of the pull-up circuits 10-1 to 10-n are controlled. Accordingly, when the driving capabilities of the pull-up circuits 10-1 to 10-n increase in response to the control signal CON3, the rising and falling transition slopes of the output data DQ increase. For this reason, the present configuration suppresses the increase in the driving capability in response to the control signals X1 to Xi, so that the rising and falling transition slopes of the output data DQ are prevented from increasing, which allows output data DQ having a constant slope to be output.

That is, when the number of the NMOS transistors N71 to N7i and the PMOS transistors P71 to P7i turned on by the control signals X1 to Xi is adjusted, the rising and falling transition slopes of the output data DQ are controlled.

The pull-down circuits 20-1 to 20n are controlled in the same manner as the pull-up circuits 10-1 to 10-n such that the number of NMOS transistors N81 to N8i and PMOS transistors P81 to P8i turned on by the control signals X21 to X2i is adjusted, so that the rising and falling transition slopes of the output data DQ are controlled.

The data output driver shown in FIG. 2 controls a change in slope according to the change in driving capability of the pull-up driver and the pull-down driver by adjusting the delay times of the delay units 30-1 to 30-n and 40-1 to 40-n, whereas the data output driver shown in FIG. 4 controls a change in slope according to the change in driving capability of the pull-up driver and the pull-down driver by adjusting the delay times of the pull-up circuits 10-1 to 10-n and the pull-down circuits 20-1 to 20-n.

Figure 5:
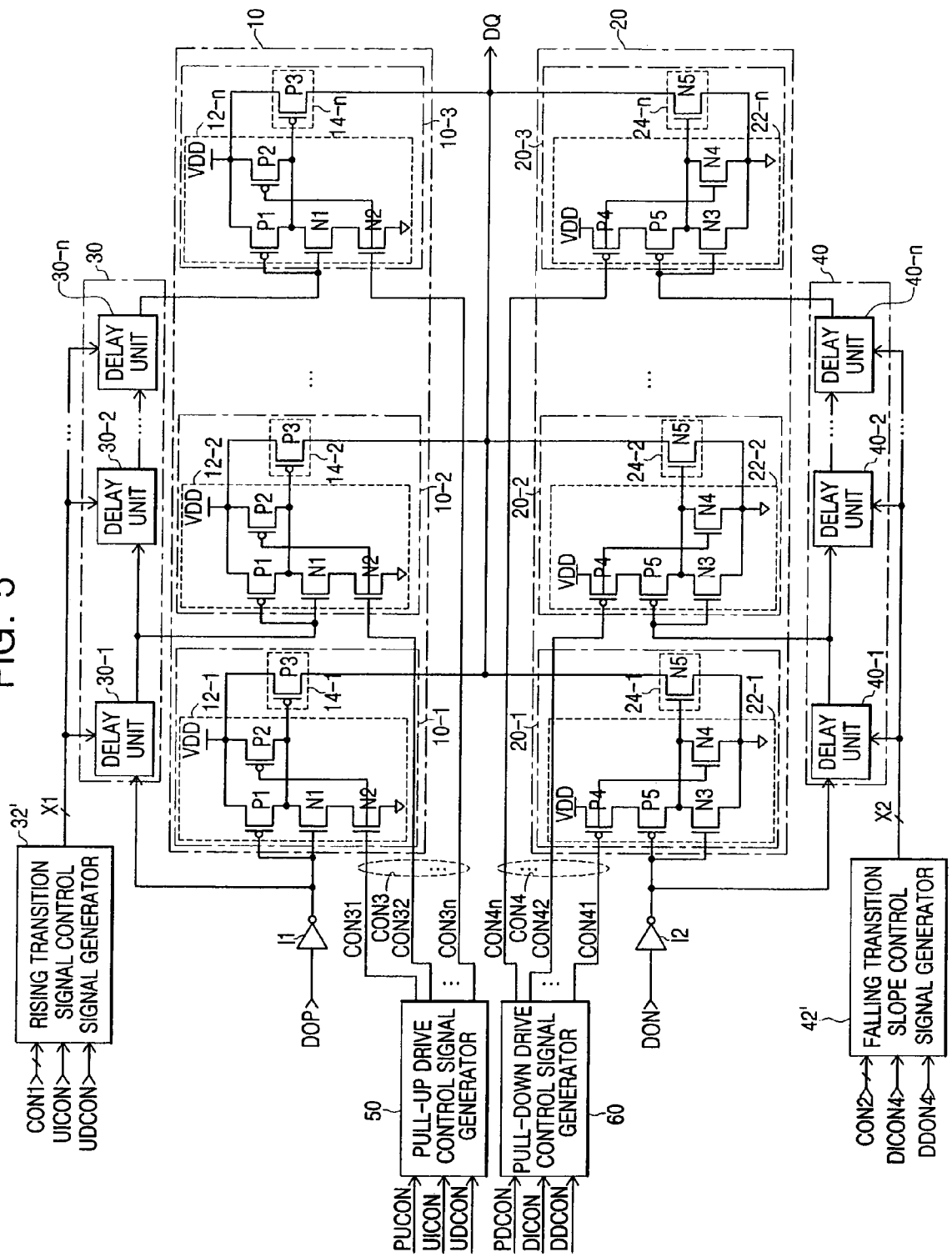
FIG. 5 is a circuit diagram illustrating the structure of a data output driver in accordance with a third embodiment of the present invention.

FIG. 5 is a diagram illustrating the structure of a data output driver in accordance with a third embodiment of the present invention, which replaces the rising transition slope control signal generator 32 of FIG. 2 with a rising transition slope control signal generator 32', and replaces the falling transition slope control signal generator 42 of FIG. 2 with a falling transition slope control signal generator 42'.

Functions of the same components as those shown in FIG. 2 will not be described, and only functions of added or replaced components will be described hereinafter.

The rising transition slope control signal generator 32' has an initial value set in response to a control signal CON1, and generates a control signal X1 that has an increased value relative to the initial value in response to a pull-up rising control signal UICON and that has a decreased value relative to the initial value in response to a pull-up falling control signal UDCON. The falling transition slope control signal generator 42' has an initial value set in response to a control signal CON2, and generates a control signal X2 that has an increased value relative to the initial value in response to a pull-down rising control signal DICON and that has a decreased value relative to the initial value in response to a pull-down falling control signal UDCON.

That is, the rising transition slope control signal generator 32' and the falling transition slope control signal generator 42' do not vary the control signals X1 and X2 in response to control signals CON3 and CON4, but instead increase or decrease the control signal X1 in response to the pull-up rising and falling control signals UICON and UDCON and increase or decrease the control signal X2 in response to the pull-down rising and falling control signals DICON and DDCON.

Figure 6:
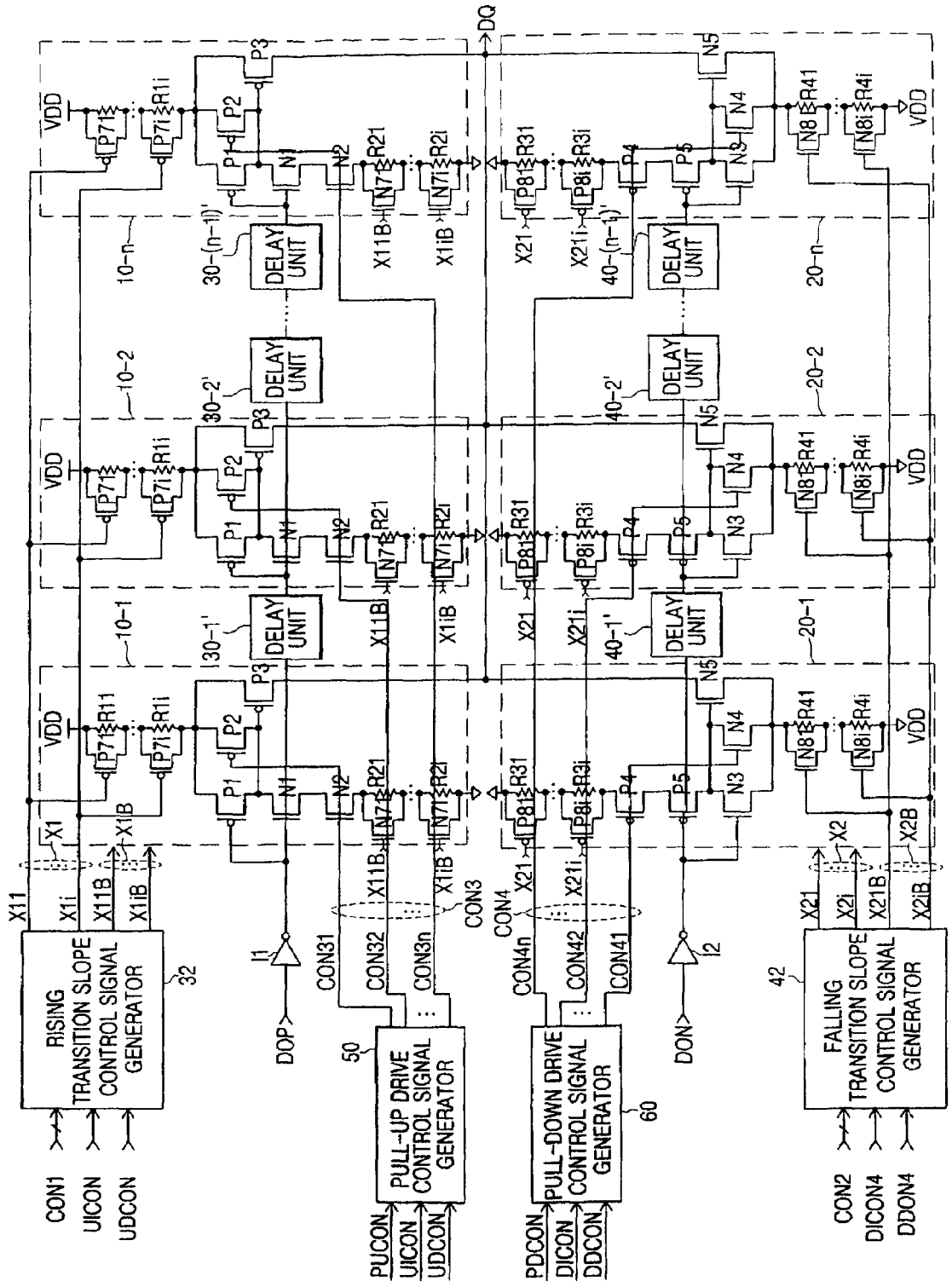
FIG. 6 is a diagram illustrating the structure of a data output driver in accordance with a fourth embodiment of the present invention.

FIG. 6 is a diagram illustrating the structure of a data output driver in accordance with a fourth embodiment of the present invention, which replaces the rising transition slope control signal generator 32 of FIG. 4 with a rising transition slope control signal generator 32', and replaces the falling transition slope control signal generator 42 of FIG. 2 with a falling transition slope control signal generator 42'.

Functions of the same components as those shown in FIG. 2 among the components shown in FIG. 6 are referred to in the description related to the functions of FIG. 4, and functions of the replaced components are better understood with reference to the description relative to FIG. 5.

That is, the rising transition slope control signal generator 32' and the falling transition slope control signal generator 42' shown in FIG. 6 do not vary control signals X1 and X2 in response to control signals CON3 and CON4, but instead increase or decrease the control signal X1 in response to pull-up rising and falling control signals UICON and UDCON and increase or decrease the control signal X2 in response to pull-down rising and falling control signals DICON and DDCON.

Figure 7:
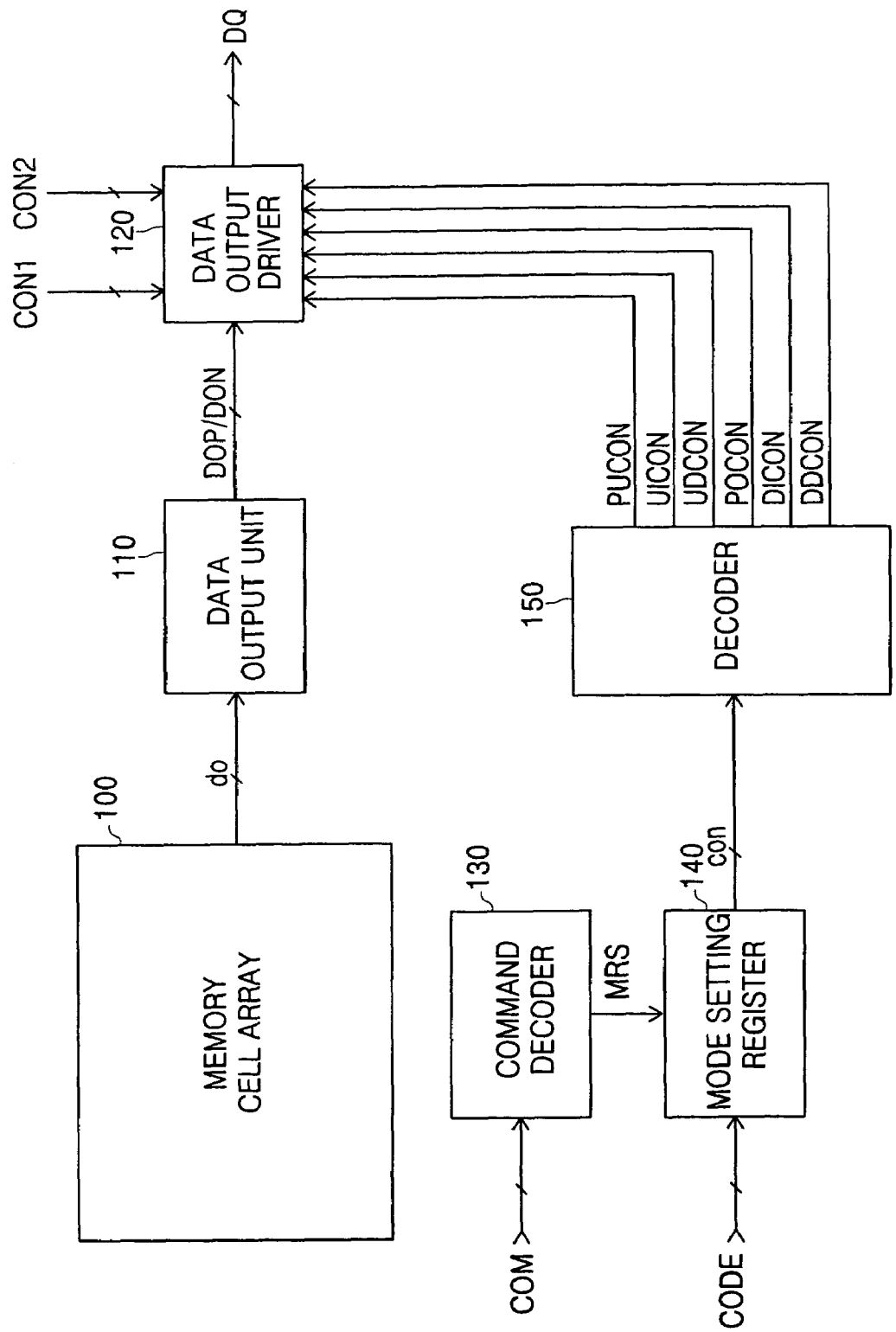
FIG. 7 is a block diagram illustrating the structure of a semiconductor memory device having a data output driver in accordance with embodiments of the present invention.

FIG. 7 is a diagram illustrating the structure of a semiconductor memory device having a data output driver in accordance with embodiments of the present invention, which includes a memory cell array 100, a data output unit 110, a data output driver 120, a command decoder 130, a mode setting register 140, and a decoder 150.

The function of the components of the semiconductor memory device shown in FIG. 7 will now be described.

The memory cell array 100 outputs data do during a read operation. The data output unit 110 generates data DON/DOP in response to the received data do. The command decoder 130 generates a mode setting command MRS in response to an externally applied command COM. The mode setting register 140 receives an externally applied code CODE and generates a control code con in response to the mode setting command MRS. The decoder 150 decodes the control code con to generate control signals PUCON, UICON, UDCON, PDCON, DICON, and DDCON. The data output driver 120 has initial values of control signals X1 and X2 set in response to control signals CON1 and CON2, generates a control signal CON3 for adjusting the pull-up driving capability in response to the control signals PUCON, UICON and UDCON, generates a control signal CON4 for adjusting the pull-down driving capability in response to the control signals PDCON, DICON and DDCON, generates the control signal X1 in response to the control signals CON1 and CON3, and generates the control signal X2 in response to the control signals CON2 and CON4. Accordingly, the driving capability of the pull-up driver in the data output driver 120 is adjusted in response to the control signal CON3, a rising transition slope of output data DQ is adjusted in response to the control signal X1, the driving capability of the pull-down driver is adjusted in response to the control signal CON4, and a falling transition slope of the output data DQ is adjusted in response to the control signal X2, thereby producing the output data DQ.

In the alternative embodiments of FIGS. 5 and 6, rather than generating the control signal X1 in response to the control signals CON1 and CON3, the control signal X1 is instead generated in response to the control signals CON1, UICON and UDCON. In addition, the data output driver 120, rather than generating the control signal X2 in response to the control signals CON2 and CON4, the control signal X2 is instead generated in response to the control signals CON2, DICON and DDCON.

Consequently, in the semiconductor memory device of the present invention, the rising and falling transition slopes of the output data can be increased or decreased when the driving capability of the pull-up driver and the driving capability of the pull-down driver are varied, so that the output data having a constant slope can be produced.

According to the data output driver and the semiconductor memory device having the same of the present invention, the rising and falling transition slopes of the output data can be constant even when the driving capability is varied, so that output data having desired characteristics can be produced.

While this invention has been particularly shown and described with references to preferred embodiments thereof, it will be understood by those skilled in the art that various changes in form and details may be made herein without departing from the spirit and scope of the invention as defined by the appended claims.

For example, the pull-up and pull-down drive control signal generators and the rising and falling transition slope control signal generators of the above-described embodiments can be formed in a number of different circuit configurations that produce the above result, for example, employing adders or counters.

What is claimed is:

1. A data output driver, comprising:
   a rising transition slope adjuster including a plurality of first delay units cascade-connected to each other and receiving data and generating delayed data, each of the first delay units having a delay time which varies in response to a first control signal;
   a falling transition slope adjuster including a plurality of second delay units cascade-connected to each other and receiving inverted data and generating delayed inverted data, each of the second delay units having a delay time which varies in response to a second control signal;
   a pull-up driver including a plurality of pull-up circuits, the driving capabilities of the pull-up circuits being adjustable in response to a third control signal, each pull-up circuit pulling-up output data in response to each of the data and the delayed data of the first delay units; and
   a pull-down driver including a plurality of pull-down circuits, the driving capabilities of the pull-down circuits being adjustable in response to a fourth control signal, each pull-down circuit pulling-down output data in response to each of the inverted data and the delayed inverted data of the second delay units,
   wherein the first control signal varies in response to the third control signal, and wherein the second control signal varies in response to the fourth control signal.

2. The data output driver according to claim 1, wherein the rising transition slope adjuster increases delay times of the first delay units in response to the first control signal when the driving capability of the pull-up driver increases in response to the third control signal, and decreases the delay times of the first delay units in response to the first control signal when the driving capability of the pull-up driver decreases in response to the third control signal.

3. The data output driver according to claim 2, wherein the rising transition slope adjuster further includes:
   a rising transition slope control signal generator having an initial value that is set in response to a fifth control signal, and varying the first control signal in response to the third control signal.

4. The data output driver according to claim 1, wherein the falling transition slope adjuster increases delay times of the second delay units in response to the second control signal when the driving capability of the pull-down driver increases in response to the fourth control signal, and decreases the delay times of the second delay units in response to the second control signal when the driving capability of the pull-down driver decreases in response to the fourth control signal.

5. The data output driver according to claim 4, wherein the falling transition slope adjuster further includes:
   a falling transition slope control signal generator having an initial value that is set in response to a sixth control signal, and varying the second control signal in response to the fourth control signal.

6. A data output driver, comprising:
a rising transition slope adjuster including a plurality of first delay units cascade-connected to each other and receiving data and generating delayed data, each of the first delay units having a delay time which varies in response to a first control signal;
a falling transition slope adjuster including a plurality of second delay units cascade-connected to each other and receiving inverted data and generating delayed inverted data, each of the second delay units having a delay time which varies in response to a second control signal;
a pull-up driver including a plurality of pull-up circuits, the driving capabilities of the pull-up circuits being adjustable in response to a third control signal, each pull-up circuit pulling-up output data in response to each of the data and the delayed data;
a pull-down driver including a plurality of pull-down circuits, the driving capabilities of the pull-down circuits being adjustable in response to a fourth control signal, each pull-down circuit pulling-down output data in response to each of the inverted data and the delayed inverted data; and
a control signal generator varying the first control signal and the third control signal together in response to a pull-up control signal, and varying the second control signal and the fourth control signal together in response to a pull-down control signal to generate the first to fourth control signals.

7. The data output driver according to claim 6, wherein the control signal generator includes:
a pull-up drive control signal generator varying the third control signal in response to the pull-up control signal;
a pull-down drive control signal generator varying the fourth control signal in response to the pull-down control signal;
a rising transition slope control signal generator having an initial value that is set in response to a fifth control signal, and varying the first control signal in response to the pull-up control signal; and
a falling transition slope control signal generator having an initial value that is set in response to a sixth control signal, and varying the second control signal in response to the pull-down control signal.

8. The data output driver according to claim 6, wherein the rising transition slope adjuster increases delay times of the first delay units in response to the first control signal when the driving capability of the pull-up driver increases in response to the third control signal, and decreases the delay times of the first delay units in response to the first control signal when the driving capability of the pull-up driver decreases in response to the third control signal.

9. The data output driver according to claim 6, wherein the falling transition slope adjuster increases delay times of the second delay units in response to the second control signal when the driving capability of the pull-down driver increases in response to the fourth control signal, and decreases the delay times of the second delay units in response to the second control signal when the driving capability of the pull-down driver decreases in response to the fourth control signal.

10. A data output driver, comprising:
a rising transition slope adjuster including a plurality of first delay units cascade-connected to each other, and receiving data and generating delayed data;
a falling transition slope adjuster including a plurality of second delay units cascade-connected to each other, and receiving inverted data and generating delayed inverted data;
a pull-up driver including a plurality of pull-up circuits, adjusting delay times of the pull-up circuits in response to a first control signal, and adjusting driving capabilities of the pull-up circuits in response to a third control signal, each pull-up circuit pulling-up output data in response to each of the data and the delayed data; and
a pull-down driver including a plurality of pull-down circuits, adjusting delay times of the pull-down circuits in response to a second control signal, and adjusting driving capabilities of the pull-down circuits in response to a fourth control signal, each pull-down circuit pulling-down output data in response to each of the inverted data and the delayed inverted data,
wherein the first control signal varies in response to the third control signal, and wherein the second control signal varies in response to the fourth control signal.

11. The data output driver according to claim 10, wherein the pull-up driver increases a delay time of each of the pull-up circuits in response to the first control signal when the driving capability of the pull-up driver increases in response to the third control signal, and decreases the delay times of the pull-up circuits in response to the first control signal when the driving capability of the pull-up driver decreases in response to the third control signal.

12. The data output driver according to claim 10, wherein the rising transition slope adjuster further includes:
a rising transition slope control signal generator having an initial value that is set in response to a fifth control signal, and varying the first control signal in response to the third control signal.

13. The data output driver according to claim 10, wherein the pull-down driver increases a delay time of each of the pull-down circuits in response to the second control signal when the driving capability of the pull-down driver increases in response to the fourth control signal, and decreases the delay time of each of the pull-down circuits in response to the second control signal when the driving capability of the pull-down driver decreases in response to the fourth control signal.

14. The data output driver according to claim 10, wherein the falling transition slope adjuster further includes:
a falling transition slope control signal generator having an initial value that is set in response to a fifth control signal, and varying the first control signal in response to the third control signal.

15. A data output driver, comprising:
a rising transition slope adjuster including a plurality of first delay units cascade-connected to each other, and receiving data and generating delayed data;
a falling transition slope adjuster including a plurality of second delay units cascade-connected to each other, and receiving inverted data and generating delayed inverted data;
a pull-up driver including a plurality of pull-up circuits, adjusting delay times of the pull-up circuits in response to a first control signal, and adjusting driving capabilities of the pull-up circuits in response to a third control signal, each of the pull-up circuits pulling-up output data in response to each of the data and the delayed data;
a pull-down driver including a plurality of pull-down circuits, adjusting delay times of the pull-down circuits in response to a second control signal, and adjusting driving capabilities of the pull-down circuits in response to a fourth control signal, each of the pull-down circuits pulling-down output data in response to each of the inverted data and the delayed inverted data; and a control signal generator varying the first control signal and the third control signal together in response to a pull-up control signal, and varying the second control signal and the fourth control signal together in response to a pull-down control signal to generate the first to fourth control signals.

16. The data output driver according to claim 15, wherein the control signal generator includes:

a pull-up drive control signal generator varying the third control signal in response to the pull-up control signal;

a pull-down drive control signal generator varying the fourth control signal in response to the pull-down control signal;

a rising transition slope control signal generator having an initial value that is set in response to a fifth control signal, and varying the first control signal in response to the pull-up control signal; and a falling transition slope control signal generator having an initial value that is set in response to a sixth control signal, and varying the second control signal in response to the pull-down control signal.

17. The data output driver according to claim 15, wherein the rising transition slope adjuster increases a delay time of each of the pull-up circuits in response to the first control signal when the driving capability of the pull-up driver increases in response to the third control signal, and decreases the delay time of each of the pull-up circuits in response to the first control signal when the driving capability of the pull-up driver decreases in response to the third control signal.

18. The data output driver according to claim 15, wherein the falling transition slope adjuster increases a delay time of each of the pull-down circuits in response to the second control signal when the driving capability of the pull-down driver increases in response to the fourth control signal, and decreases the delay time of each of the pull-down circuits in response to the second control signal when the driving capability of the pull-down driver decreases in response to the fourth control signal.

19. A semiconductor memory device, comprising:

a memory cell array outputting stored data during a read operation;

a data output unit receiving the read data output from the memory cell array and outputting data and inverted data;

a command decoder decoding an externally applied command and generating a mode setting command;

a control signal setting unit receiving a code in response the mode setting command, and outputting a pull-up control signal and a pull-down control signal from the received code;

a rising transition slope adjuster including a plurality of first delay units cascade-connected to each other and receiving the data and generating delayed data, each of the first delay units having a delay time which varies in response to a first control signal;

a falling transition slope adjuster including a plurality of second delay units cascade-connected to each other and receiving the inverted data and generating delayed inverted data, each of the second delay units having a delay time which varies in response to a second control signal;

a pull-up driver including a plurality of pull-up circuits, the driving capabilities of the pull-up circuits being adjustable in response to a third control signal, each of the pull-up circuits pulling-up output data in response to each of the data and the delayed data;

a pull-down driver including a plurality of pull-down circuits, the driving capabilities of the pull-down circuits being adjustable in response to a fourth control signal, each of the pull-down circuits pulling-down output data in response to each of the inverted data and the delayed inverted data; and a control signal generator varying the first control signal and the third control signal in response to the pull-up control signal, and varying the second control signal and the fourth control signal in response to the pull-down control signal to generate the first to fourth control signals.

20. The semiconductor memory device according to claim 19, wherein the control signal generator includes:

a pull-up drive control signal generator varying the third control signal in response to the pull-up control signal;

a pull-down drive control signal generator varying the fourth control signal in response to the pull-down control signal;

a rising transition slope control signal generator having an initial value that is set in response to a fifth control signal, and varying the first control signal in response to the pull-up control signal; and a falling transition slope control signal generator having an initial value that is set in response to a sixth control signal, and varying the second control signal in response to the pull-down control signal.

21. The semiconductor memory device according to claim 19, wherein the control signal generator includes:

a pull-up drive control signal generator varying the third control signal in response to the pull-up control signal;

a pull-down drive control signal generator varying the fourth control signal in response to the pull-down control signal;

a rising transition slope control signal generator having an initial value set in response to a fifth control signal, and varying the first control signal in response to the third control signal; and a falling transition slope control signal generator having an initial value set in response to a sixth control signal, and varying the second control signal in response to the fourth control signal.

22. The semiconductor memory device according to claim 19, wherein the rising transition slope adjuster increases delay times of the first delay units in response to the first control signal when the driving capability of the pull-up driver increases in response to the third control signal, and decreases the delay times of the first delay units in response to the first control signal when the driving capability of the pull-up driver decreases in response to the third control signal.

23. The semiconductor memory device according to claim 19, wherein the falling transition slope adjuster increases delay times of the second delay units in response to the second control signal when the driving capability of the pull-down driver increases in response to the fourth control signal, and decreases the delay times of the second delay units in response to the second control signal when the driving capability of the pull-down driver decreases in response to the fourth control signal.

24. A semiconductor memory device, comprising:
a memory cell array outputting stored data during a read operation;
a data output unit receiving the read data output from the memory cell array and outputting data and inverted data;
a command decoder decoding an externally applied command and generating a mode setting command;
a control signal setting unit receiving a code in response the mode setting command, and outputting a pull-up control signal and a pull-down control signal from the received code;
a rising transition slope adjuster including a plurality of first delay units cascade-connected to each other, and receiving data and generating delayed data;
a falling transition slope adjuster including a plurality of second delay units cascade-connected to each other, and receiving inverted data and generating delayed inverted data;
a pull-up driver including a plurality of pull-up circuits, adjusting delay times of the pull-up circuits in response to a first control signal, and adjusting driving capabilities of the pull-up circuits in response to a third control signal, each of the pull-up circuits pulling-up output data in response to each of the data and the delayed data;
a pull-down driver including a plurality of pull-down circuits, adjusting delay times of the pull-down circuits in response to a second control signal, and adjusting driving capabilities of the pull-down circuits in response to a fourth control signal, each of the pull-down circuits pulling-down output data in response to each of the inverted data and the delayed inverted data; and
a control signal generator varying the first control signal and the third control signal in response to the pull-up control signal, and varying the second control signal and the fourth control signal in response to the pull-down control signal to generate the first to fourth control signals.

25. The semiconductor memory device according to claim 24, wherein the control signal generator includes:
a pull-up drive control signal generator varying the third control signal in response to the pull-up control signal;
a pull-down drive control signal generator varying the fourth control signal in response to the pull-down control signal;
a rising transition slope control signal generator having an initial value that is set in response to a fifth control signal, and varying the first control signal in response to the pull-up control signal; and
a falling transition slope control signal generator having an initial value that is set in response to a sixth control signal, and varying the second control signal in response to the pull-down control signal.

26. The semiconductor memory device according to claim 24, wherein the control signal generator includes:
a pull-up drive control signal generator varying the third control signal in response to the pull-up control signal;
a pull-down drive control signal generator varying the fourth control signal in response to the pull-down control signal;
a rising transition slope control signal generator having an initial value that is set in response to a fifth control signal, and varying the first control signal in response to the third control signal; and
a falling transition slope control signal generator having an initial value that is set in response to a sixth control signal, and varying the second control signal in response to the fourth control signal.

27. The semiconductor memory device according to claim 24, wherein the rising transition slope adjuster increases a delay time of each of the pull-up circuits in response to the first control signal when the driving capability of the pull-up driver increases in response to the third control signal, and decreases the delay time of each of the pull-up circuits in response to the first control signal when the driving capability of the pull-up driver decreases in response to the third control signal.

28. The semiconductor memory device according to claim 24, wherein the falling transition slope adjuster increases a delay time of each of the pull-down circuits in response to the second control signal when the driving capability of the pull-down driver increases in response to the fourth control signal, and decreases the delay time of each of the pull-down circuits in response to the second control signal when the driving capability of the pull-down driver decreases in response to the fourth control signal.

* * * * *